United States Patent
Stanescu

(10) Patent No.: US 11,611,320 B2
(45) Date of Patent: Mar. 21, 2023

(54) DIFFERENTIAL OPERATIONAL TRANSCONDUCTANCE AMPLIFIER FOR CHOPPER-STABILIZED AMPLIFICATION

(71) Applicant: SEMICONDUCTOR COMPONENTS INDUSTRIES, LLC, Phoenix, AZ (US)

(72) Inventor: Cornel D. Stanescu, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/304,132

(22) Filed: Jun. 15, 2021

(65) Prior Publication Data

US 2022/0069789 A1    Mar. 3, 2022

Related U.S. Application Data

(60) Provisional application No. 63/070,332, filed on Aug. 26, 2020.

(51) Int. Cl.
   *H03F 3/45*    (2006.01)
   *H03F 3/393*   (2006.01)

(52) U.S. Cl.
   CPC ......... *H03F 3/45269* (2013.01); *H03F 3/393* (2013.01); *H03F 2200/129* (2013.01)

(58) Field of Classification Search
   CPC ................ H03F 3/45269; H03F 3/393; H03F 2200/129; H03F 3/45475; H03F 3/45632
   USPC .................................................. 330/252–261
   See application file for complete search history.

(56) References Cited

U.S. PATENT DOCUMENTS

| 8,350,622 B2 * | 1/2013 | Kumar | H03F 3/45071 330/261 |
|---|---|---|---|
| 2015/0270811 A1 | 9/2015 | Chen | |

OTHER PUBLICATIONS

Rod Burt et al., "A Micropower Chopper-Stabilized Operational Amplifier Using a SC Notch Filter with Synchronous Integration Inside the Continuous-Time Signal Path," IEEE Journal of Solid-State Circuits, vol. 41, No. 12, pp. 2729-2736, Dec. 2006.

(Continued)

*Primary Examiner* — Hieu P Nguyen
(74) *Attorney, Agent, or Firm* — Brake Hughes Bellermann LLP

(57) ABSTRACT

A differential operational transconductance amplifier, or DOTA, intended to be used in zero-drift precision operational amplifiers as chopper amplifier stage is disclosed. The DOTA is configured to function with a low-voltage power supply and to have good performance based on circuitry configured to provide a constant gain over a range of common-mode voltages, or VCM. The DOTA further includes bias circuitry configured to respond to the common mode voltage in order to prevent large currents, which can result from the constant gain circuitry, from negatively affecting performance. The DOTA further includes current sources that are configured to prevent temperature variations from negatively affecting performance. The DOTA further includes VCM-driven bias voltages used to optimize the operating point of the differential output stage. The DOTA uses input and input replica transistors having medium threshold voltage, which results in capability to operate at low supply voltages.

19 Claims, 9 Drawing Sheets

(56) References Cited

OTHER PUBLICATIONS

Cornel Stanescu et al., "Optimizing Frequency Compensation in Chopper Offset-Stabilized Amplifiers with Symmetrical RC Notch Filters," Proceedings of the Romanian International Conference on Semiconductors (CAS), pp. 167-170, 2015.
Johan Huijsing, "Operational Amplifiers—Theory and Design," Springer, Second Edition, pp. 82-87 & pp. 91-93, 2011.
Yoshinori Kusuda, "A 5.6 nV/√Hz Chopper Operational Amplifier Achieving a 0.5 μV Maximum Offset Over Rail-to-Rail Input Range with Adaptive Clock Boosting Technique," IEEE Journal of Solid-State Circuits, vol. 51, No. 9, pp. 2119-2128, Sep. 2016.
Johan F. Witte et al., "Dynamic Offset Compensated CMOS Amplifiers," Springer, pp. 4-5, 2009.

\* cited by examiner

DIFFERENTIAL OPERATIONAL TRANSCONDUCTANCE AMPLIFIER FOR CHOPPER-STABILIZED AMPLIFICATION

CROSS-REFERENCE TO RELATED APPLICATION

This application claims the benefit of U.S. Provisional Application No. 63/070,332, filed on Aug. 26, 2020, which is hereby incorporated by reference in its entirety.

FIELD OF THE DISCLOSURE

The present disclosure relates to precision zero-drift chopper-stabilized operational amplifiers (i.e. opamps) and more specifically to a differential operational transconductance amplifier (i.e. DOTA) suitable for use within the opamp, for example as a chopper amplifier stage.

BACKGROUND

A precision opamp may need to accurately sense a very small (e.g., microvolt) differential voltage at its input. The accuracy of this measurement can be affected by a parameter of the opamp known as input offset voltage (VOS). An input offset voltage is a finite voltage that appears at the input of an operational amplifier (i.e., opamp) when each input of the opamp is grounded. In other words, the input offset voltage can limit the minimum differential voltage that can be accurately measured at the input of the opamp.

SUMMARY

In at least one aspect, the present disclosure generally describes a differential operational transconductance amplifier (DOTA). The DOTA include an input stage that is coupled to an input of the DOTA. The input of the DOTA includes a positive input and a negative input that are configured to receive a common mode voltage. The DOTA further includes a replica input stage that is coupled to the input of the DOTA. The replica input stage has a transistor configuration corresponding to the input stage. Further, the replica input stage is reduced in transistor size (i.e., has transistors that are smaller) relative to the input stage to reduce a current drawn by the DOTA. The replica input stage is configured to conduct a current in response to the common mode voltage at the input of the DOTA. The DOTA further includes a plurality of bias conditioning circuits that are configured to detect the current conducted by the replica input stage and to output a bias current to the input stage based on the current conducted by the replica input stage such that the input stage is biased based on the common mode voltage.

In a possible implementation of the DOTA, the input stage is biased based on the common mode voltage so that a gain of the input stage is approximately constant for a range of common mode voltages. The range of common mode voltages are from at least a lower rail voltage to an upper rail voltage of the DOTA.

In another possible implementation of the DOTA, the input stage includes a pair of NMOS transistors that are coupled to the positive input and the negative input and a pair of PMOS transistors that are coupled to the positive input and the negative input. The pair of NMOS transistor have a medium threshold that corresponds to a positive supply voltage, while the pair of PMOS transistors have a PMOS medium threshold that corresponds to a negative supply voltage. For example, the NMOS medium threshold voltage can be in a range of about 0.5V to 0.6V for a positive supply voltage of about 0.8V, and the PMOS medium threshold voltage can be in a range of about −0.5V to −0.6V for a negative supply voltage of about −0.8V. The PMOS bias conditioning circuit can be configured to bias the pair of PMOS transistors with a PMOS bias current and the NMOS bias conditioning circuit can be configured to bias the pair of NMOS transistors with an NMOS bias current. The transistors of the input stage can be operated in weak inversion. For this operation, the actual values of the NMOS threshold voltage can be with up to 100 mV smaller. For the PMOS transistors, the same amount will be added to their threshold voltage. The PMOS bias current is equal to an intermediate bias current for an intermediate common mode voltage (VCM) and the NMOS bias current is equal to the intermediate bias current for the intermediate VCM. For a low VCM, the PMOS bias current is higher than the intermediate bias current and the NMOS bias current is lower than the intermediate bias current. For a high VCM, the PMOS bias current is lower than the intermediate bias current and the NMOS bias current is higher than the intermediate bias current.

In another possible implementation of the DOTA, the replica input stage includes a pair of NMOS transistors that are coupled to the positive input and the negative input and have a NMOS medium threshold that corresponds to a positive supply voltage. The replica input stage also includes a pair of PMOS transistors that are coupled to the positive input and the negative input and have a PMOS medium threshold that corresponds to a negative supply voltage. For example, the replica input stage has transistors that are approximately three times smaller than transistors of the input stage.

In another possible implementation of the DOTA, the bias conditioning circuits include a PMOS bias conditioning circuit that includes PMOS transistors. Each of the PMOS transistors has a PMOS low threshold that can be in a range of about −0.35V to 0.45V. The bias conditioning circuits further include a NMOS bias conditioning circuit that includes NMOS transistors. Each of the NMOS transistors have a NMOS low threshold that can be in a range of about +0.35V to +0.45V. These threshold values correspond to operation in strong inversion, which is customary in current sources as those configured within the disclosed bias conditioning circuits.

In another possible implementation, the DOTA includes a differential high-impedance output stage that is configured to receive output currents from the input stage. The DOTA further includes current divider circuits that are positioned between the input stage and the output stage that are configured to reduce the output currents from the input stage before reaching the output stage (e.g., by dividing the output currents).

In another aspect, the present disclosure generally describes a chopper-stabilized amplifier that includes a main amplifier and a chopper amplifier. The main amplifier is configured to receive an input signal at an input with an offset voltage. The chopper amplifier is coupled between a first chopper that is configured to receive the input signal and a second chopper that is configured transmit an output signal to the main amplifier in order to reduce (e.g., make less than or equal to an offset voltage of opamps without chopper-stabilization) the input offset voltage. The chopper amplifier may be implemented using a differential operational transconductance amplifier (DOTA). Accordingly, the chopper amplifier includes an input stage that is coupled to an input of the chopper amplifier. The input of the chopper amplifier includes a positive input and a negative input that are configured to receive a common mode voltage. The chopper amplifier further includes a replica input stage that is coupled to the input of the chopper amplifier. The replica input stage has a transistor configuration corresponding to the input stage. Further, the replica input stage is reduced in transistor size (i.e., has transistors that are smaller) relative to the input stage to reduce a current drawn by the chopper amplifier. The replica input stage is configured to conduct a current in response to the common mode voltage at the input of the chopper amplifier. The chopper amplifier further includes a plurality of bias conditioning circuits that are configured to detect the current conducted by the replica input stage and to output a bias current to the input stage based on the current conducted by the replica input stage such that the input stage is biased based on the common mode voltage.

In another aspect, the present disclosure generally describes a method. The method includes receiving a common mode voltage at an input of a differential operational transconductance amplifier (DOTA). The DOTA includes an input stage, a replica input stage, a plurality of bias conditioning circuits, a plurality of current divider circuits, and an output stage. The method further includes conducting current at the replica input stage in response to the common mode voltage at the input of the DOTA. The replica input stage is coupled to the input of the DOTA and includes transistors that are smaller than transistors of the input stage in order to reduce a current drawn by the DOTA. The method further includes detected the current conducted by the replica input stage using the plurality of bias conditioning circuits. The method further includes outputting, from the plurality of bias conditioning circuits, a bias current to the input stage that is based on the current conducted by the replica input stage so that the input stage is biased based on the common mode voltage. The method further includes outputting, from the plurality of bias conditioning circuits, bias currents that are based on the common mode voltage in order to reduce output currents from a plurality of current divider circuits, which are positioning between the input stage and the output stage in order to reduce the output currents form the input stage. The method further includes receiving the reduced output currents from the input stage at the output stage of the DOTA.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

To accurately sense a very small (e.g., microvolt) differential voltage, an opamp may require a small input offset voltage (VOS). While CMOS may be a preferred technology for opamps, it may result in a poor (i.e., larger than desired) input offset voltage because of mismatches between transistors (e.g., in an input differential pair) that result from fabrication and/or material variances. Trimming the mismatches can reduce the input offset voltage but is generally tuned to a particular temperature and age of the device. As a result, even an offset-trimmed opamp may have an input offset voltage that drifts over temperature and time. An input offset voltage that changes with time and/or temperature (i.e., offset drift) may be stabilized (i.e., compensated) using a chopping technique (i.e., chopper stabilization) to distinguish and remove the input offset voltage from an output of the opamp.

Figure 1:
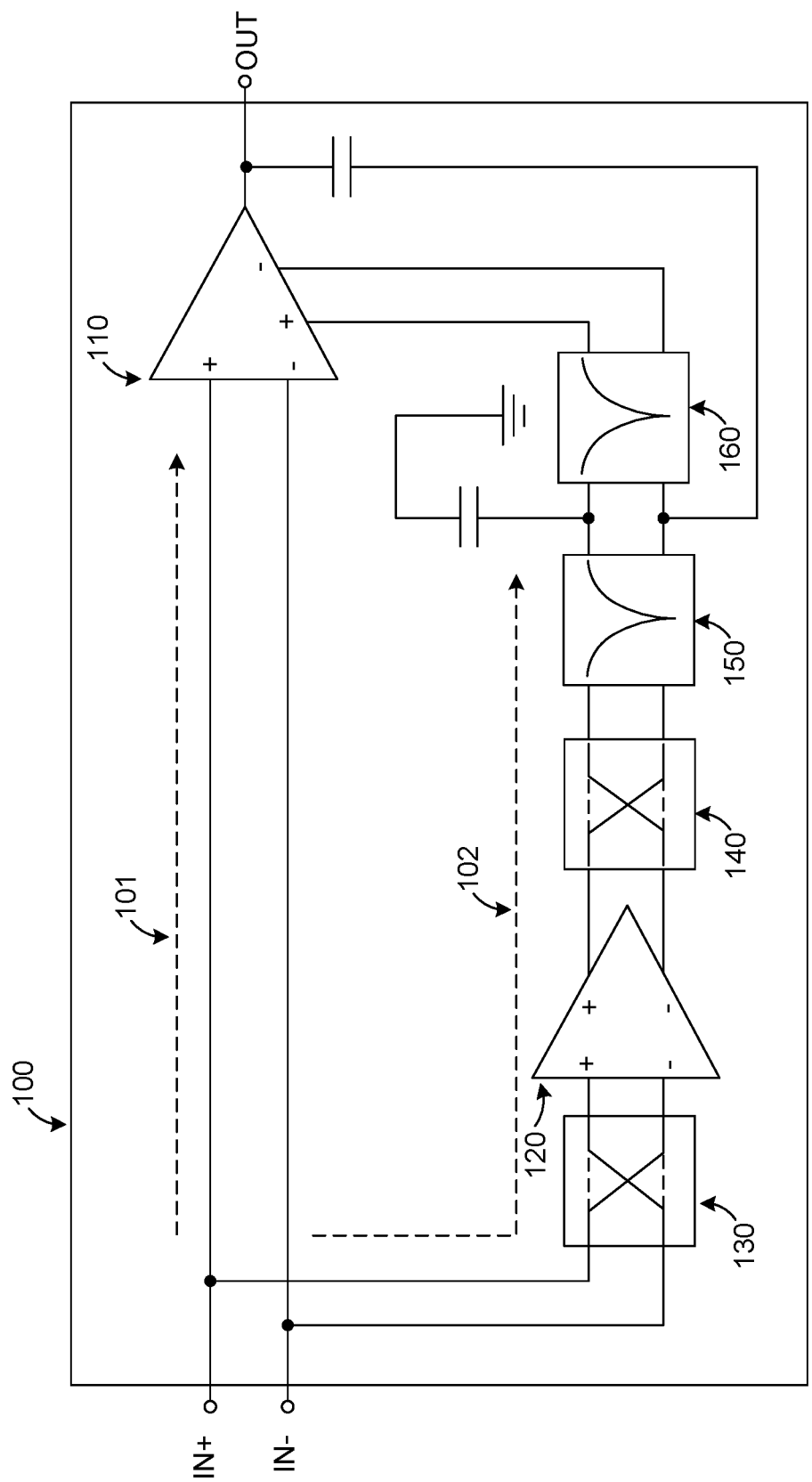
FIG. 1 is a block diagram of an opamp with chopper-stabilization according to a first possible implementation of the present disclosure.

FIG. 1 illustrates a block diagram of a chopper-stabilized operational amplifier (i.e. chopper-stabilized amplifier) according to an implementation of the present disclosure. The chopper-stabilized amplifier 100 is configured to receive a differential input (VIN+−VIN−) voltage (i.e., signal) between a positive input terminal (IN+) and a negative input terminal (IN−). The signal is split between a first path 101 (i.e., high-frequency path) and a second path 102 (i.e., low-frequency path). The first path includes a main amplifier 110 (i.e., main opamp) that has an associated offset voltage (VOS) (i.e., offset) between its positive input terminal and its negative input terminal. Accordingly, if the offset voltage is not compensated, then the output voltage (VOUT) at an output terminal (OUT) can be given as a gain (A) multiplied by the sum of the signal of the offset (i.e., VOUT=A(VIN+−VIN−+VOS)).

The main amplifier 110 may have an input offset voltage (VOS) that is compensated (i.e., removed) by an offset voltage measured using circuitry in the second path 102. The second path 102 includes a nulling amplifier (i.e., chopper amplifier 120) that is coupled after a first chopper 130. The first chopper 130 modulates the signal to a chopping frequency. The chopper amplifier 120 can be configured to amplify and invert the chopped (i.e. modulated) signal. The chopper amplifier 120 also has an offset voltage that substantially matches the offset voltage of the main amplifier 110. The offset voltage of the chopper amplifier 120 is added after the signal is chopped (i.e., modulated) by the first chopper 130. A second chopper 140 is used to demodulate the signal that was modulated by the first chopper 130. The second chopper 140 is further configured to modulate the offset voltage which was added to the signal by the chopper amplifier 120. Accordingly, after the second chopper 140, the signal and the offset are at different frequencies. The second path 102 may further include notch filters 150, 160 that can be tuned to harmonics (1st harmonic, 5th harmonic) of the switching frequency to remove the glitches from the output of the second path 102 and to condition the output of the second path to offset compensate the main amplifier 110. In other words, the main amplifier 110 can effectively include an auxiliary input 111. A correction signal from the second path 102 may be applied to the auxiliary input 111 to cancel the offset voltage (VOS) and reduce (e.g., cancel) the 1/f noise at the output of the main amplifier (OUT).

Figure 2:
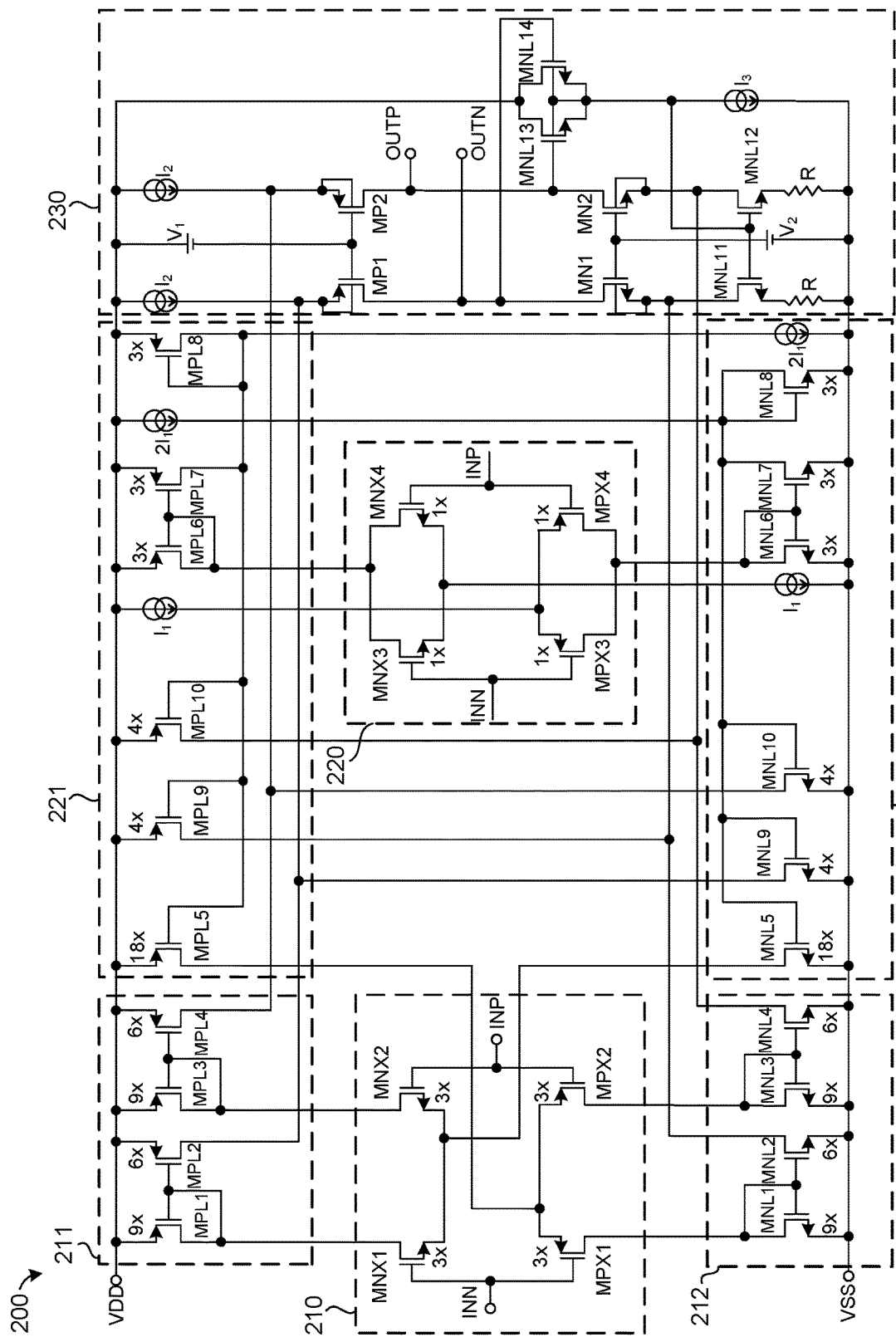
FIG. 2 is a schematic of a differential operational transconductance amplifier (i.e., DOTA) that can be used with the opamp having chopper stabilization according to a first possible implementation of the present disclosure.

FIG. 2 is a schematic of an implementation of a differential operational transconductance amplifier or DOTA that can be used as a chopper amplifier 120 in a chopper-stabilized amplifier, such as shown in FIG. 1. The circuitry of the disclosed DOTA can provide a variety of technical effects.

A first technical effect of the disclosed DOTA is its ability to operate at low voltages. A voltage (i.e., supply voltage) may be considered high or low relative to a threshold voltage of a typical transistor. A threshold voltage (VTH) of a typical transistor may be around 0.8V. When a supply voltage (VDD or VSS) is within about 0.1 volts of this typical VT, the supply is may be considered low voltage. In other words the disclosed DOTA is a low-voltage DOTA As shown in FIG. 2, the DOTA 200 is powered in a low voltage domain by an upper rail voltage (VDD), which may be +800 millivolts (mV), and a lower rail voltage (VSS), which may be −800 mV. To maintain operation at a reliable operating point in this low voltage domain, the disclosed DOTA may include transistors having threshold voltages that are lower than a normal (i.e. typical) threshold voltage of about 0.8V.

A second technical effect of the disclosed DOTA is its ability to provide a substantially constant gain (gm). In other words, the disclosed DOTA is a constant-gm DOTA. The constant-gm can maintain a performance of the DOTA over a common-mode voltage range of approximately VDD–VSS (e.g., 1.6 volts (V)). By maintaining a constant (gm) over the common-mode voltage range, the DOTA can reduce (or eliminate) any (or all) of the following negative performance issues: (i) an increased offset voltage (VOS), (ii) a reduced common-mode rejection ratio (CMRR), (iii) a reduced gain-bandwidth product (GBW), (iv) a change (e.g., reduction) in slew rate, and (v) a higher total harmonic distortion plus noise (THD+noise) error. In other words, the performance (e.g., noise, GBW, phase margin, etc.) may be substantially constant over a common-mode voltage range (e.g., the entire common-mode voltage range).

A common-mode voltage range (i.e., VCM-range) can be an approximately a rail-to-rail voltage range for the supply. For example, a common-mode voltage (VCM) can be in a range (i.e., domain) that includes the rail voltages of the supply. For example, a minimum VCM (i.e., VCMMIN) can be 0.1V lower than VSS, while a maximum VCM (i.e., VCMMAX) can be 0.1V higher than VDD. When a VCM is said to be close to VCMMIN it can be a VCM that is VSS-0.1V≤VCM≤VSS+VTHN and when a VCM is said to be close to VCMMAX it can be a VCM that is VDD+VTHP≤VCM≤VDD+0.1V. When a VCM is said to be intermediate it can be a VCM that is (VSS+2(VTHN))≤VCM≤(VDD+2(VTHP)). VTHN and VTHP are the threshold voltages for the NMOS and PMOS transistors and are positive and negative voltages, respectively.

A third technical effect of the disclosed DOTA is its ability to provide the substantially constant-gm using less current than other approaches. The DOTA may include a constant-gm circuit to maintain gm over the common-mode voltage range. This constant-gm circuit may draw additional current.

The amount of additional current needed for the constant-gm circuit for the disclosed DOTA may be less than other approaches. For example, the disclosed DOTA may draw less than or equal to 100% (i.e., ≤2×) additional current. In other words, the disclosed DOTA may have a quiescent current (IQ) that is lower than other approaches.

A fourth technical effect of the disclosed DOTA is its ability to reduce output currents fed from a first stage (i.e., input stage) to a second stage (i.e., output stage). For this, the DOTA can include use of current dividers based on common-mode voltage (VCM) driven sources. Without these current dividers, the current fed to the output stage can be doubled near the edges of the VCM range (i.e., near the rails of the supply). This increase in current can change the operating point of the output stage, thereby reducing a performance (e.g., CMRR). By controlling the current fed from the input stage to the output stage, the DOTA can maintain a high CMRR over a range of common-mode voltages (e.g., an entire range of common-mode voltages).

A fifth technical effect of the disclosed DOTA is its flat gain response for the output stage over the range of common-mode voltages. For this, the DOTA includes a VCM driven bias voltage to maintain an operating point of transistors in the output stage.

The DOTA 200 includes an input stage 210 that includes a first NMOS transistor (MNX1) and a first PMOS transistor (MPX1) coupled to a negative input terminal (INN). Additionally, the input stage includes a second N-type transistor (MNX2) and a second P-type transistor (MPX2) coupled to a positive input terminal (INP). Each of the transistors of the input stage are designated with an "X" to indicate that they are medium threshold transistors. For example, an NMOS medium threshold for the NMOS transistors may be +0.5V to +0.6V, while a PMOS medium threshold for the PMOS transistors may be −0.5V to −0.6V. For comparison, an NMOS normal threshold can be about 0.8V to 0.9V, while an NMOS low threshold (e.g., designated with an "L") can be about 0.35V to 0.45V. The medium threshold transistors (NMOS and PMOS) are included for operation with the low supply voltage.

The input stage 210 can be a symmetrical topology of medium threshold voltage NMOS and PMOS transistors. The back-gates of the NMOS and PMOS transistor can be connected to the VSS and VDD supply rails. The transistors of the input stage 210 (i.e., the input transistors) can be operated in a condition in which gm is proportional to the bias current (i.e., in a weak inversion). The NMOS transistors (MNX1, MNX2) of the input stage 210 are coupled to a transistor (MNL5) of an NMOS bias conditioning circuit 222 to receive a bias current, which controls an operating point of the NMOS transistors (MNX1, MNX2). Likewise, the PMOS transistors (MPX1, MPX2) of the input stage 210 are coupled to a transistor (MPL5) of a PMOS bias conditioning circuit 221 to receive a bias current, which controls an operating point of the PMOS transistors (MPX1, MPX2). The DOTA 200 further includes a replica input stage 220 configured to sense a common mode voltage (VCM) and to control the bias currents output by the PMOS bias conditioning circuit 221 and the NMOS bias conditioning circuit 222 according to the common mode voltage so that the input stage 210 is biased properly (e.g., for constant-gm) as the common mode voltage is changed (i.e. for a range of common mode voltages).

As shown in FIG. 2, the replica input stage 220 is coupled in parallel with the input stage 210 and is configured to follow (i.e., mirror, duplicate) an operating point of the input stage 210 without affecting the signal path of the input stage 210. In other words, the replica input stage 220 can be configured to sense a common mode voltage (VCM) present at the input stage 210. The replica input stage 220 is coupled to bias conditioning circuits 221, 222, and the bias conditioning circuits 221, 222 are coupled to the input stage 210. Accordingly, a feedback loop is formed to control the operating point of the input stage 210 based on the common mode voltage (VCM) in order to maintain a constant-gm over a portion of the VCM domain (e.g., an entire VCM domain).

The replica input stage 220 includes a third N-type transistor (MNX3) and a third P-type transistor (MPX3) coupled to a negative input terminal (INN). The third N-type transistor (MNX3) and the third P-type transistor (MPX3) can be sized smaller (e.g., 3× smaller) than the first N-type transistor (MNX1) and the first P-type transistor (MPX1), respectively. Additionally, the replica input stage includes a fourth N-type transistor (MNX4) and a fourth P-type transistor (MPX4) coupled to a positive input terminal (INP). The fourth N-type transistor (MNX4) and the fourth P-type transistor (MPX4) can be sized smaller (e.g., 3× smaller) than the second N-type transistor (MNX2) and the second P-type transistor (MPX2), respectively. The smaller size of the transistors in the replica input stage 220 reduces a current drawn by the replica input stage 220 relative to a current drawn by the input stage 210. In other words, the replica input stage 220 can use the same type of transistors as the input stage 210 and can have a similar (e.g., the same) load configuration as the input stage 210 in order to replicate the operating point for the corresponding transistors in the input stage 210 and the replica input stage 220.

Each transistor in the replica input stage 220 is smaller than its counterpart transistor in the input stage 210. As shown, the transistors in the replica input stage 220 can be smaller than the counterpart transistors in the input stage by a factor of 3 in order to facilitate a centroid layout for the merged input stage and replica input stage. A shrinking factor for the transistors of the replica input stage is not limited to 3 but can be also 5 or 7. A higher shrinking factor reduces the current consumption of the replica input stage, however, can increase mismatching between the transistors, leading to a reduction of VOS and CMRR performance. A shrinking factor of 3 was chosen to facilitate the drawing of both input stages together, merged, by using the known centroid layout technique (e.g., as 3+1=4) for matching.

The replica input stage 220 is biased by two current generators. A first current generator is configured to source I1 to the replica input stage 220 and a second current generator is configured to sink I1 from the replica input stage 220. The first current generator and the second current generator are configured to have a response to temperature that is proportional to absolute temperature (PTAT) in order to maintain a substantially constant gm over a temperature range (e.g. −40° C.≤T≤125° C.). The first current generator and the second current generator are configured (e.g., matched) to provide substantially the same current levels.

The drains of the NMOS transistors of the replica input stage 220 (i.e., MNX3, MNX4) are coupled together at a first output of the replica input stage. Likewise, the drains of the PMOS transistors of the replica input stage 220 (i.e., MPX3, MPX4) are coupled together at a second output of the replica input stage 220. The first output of the replica input stage is coupled to a PMOS bias conditioning circuit 221 and the second output of the replica input stage is coupled to an NMOS bias conditioning circuit 222. The PMOS bias conditioning circuit 221 includes low-threshold PMOS transistors, while the NMOS bias conditioning circuit 222 includes low-threshold NMOS transistors.

The PMOS bias conditioning circuit 221 and the NMOS bias conditioning circuit are configured by the output of the replica input stage to generate currents to adjust the bias currents supplied to input stage 210 by an amount corresponding to VCM. The drains of the transistors of replica input stage 220 are connected together within each pair to drive current sources (low threshold MPL6-MPL7, MNL6-MNL7). These current sources are used to control the current through the diode-connected low threshold MNL8 and MPL8 over the VCM domain. MNL8 and MPL8 are biased by two identical PTAT current generators having twice the value of those biasing the replica input stage (i.e., 2I1).

The PMOS bias conditioning circuit 221 includes a first diode-connected PMOS transistor (MPL6), which is configured to read the current through the NMOS transistors (MNX3, MNX4) of the replica input stage. The PMOS conditioning circuit 221 further includes a second diode-connected PMOS transistor (MPL8). The second diode-connected PMOS transistor (MPL8) is configured to read the current from a current source that is double the current used to bias the replica input stage (i.e., 2I1). The PMOS bias conditioning circuit 221 is configured so that the current flowing through MPL6 is subtracted from the current flowing toward MPL8 (i.e., 2I1) to form a difference current that is flowing through MP8. This difference current is provided to an output PMOS transistor MPL5 with an amplification determined by a size difference between the output PMOS transistor (MPL5) and the second diode-connected PMOS transistor (MPL8). As shown in FIG. 2, MPL5 has a size factor of 18× while MPL8 has a size factor of 3x. Accordingly, the difference current is amplified at MPL5 by 6 times. This amplified current is used to bias the PMOS transistors (MPX1, MPX2) of the input stage 210.

For example, when VCM is intermediate in the range of VCM, the current through the first diode-connected transistor MPL6 of the PMOS conditioning circuit 221 can be I1, thereby making the difference current 2I1−I1=I1. Accordingly, the current provided to the input stage 210 for an intermediate VCM is 6I1. As VCM is decreased (relative to the medium threshold of the transistors in the replica input stage 220), the NMOS transistors of the replica input stage 220 can turn OFF. In other words, when VCM is close to VCMMIN, the NMOS transistors turn OFF thereby making the current through the first diode-connected PMOS transistor (MPL6) equal to zero. Accordingly, the difference current increases accordingly to 2I1−0=2I1 (i.e., the difference current doubles). Accordingly, the bias current provided to the PMOS transistors (MPX1, MPX2) of input stage 210 for a low VCM is doubled (e.g., 2·6I1=12I1). This increase in the bias current to the PMOS transistors (MPX1, MPX2) can maintain the gain (gm) of the input stage 210 because it compensates for the NMOS transistors (MNX1, MNX2) of the input stage 210 being turned OFF by the low common mode voltage (VCM). On the other hand, as VCM is increased the bias current provided to the PMOS transistors (MPX1, MPX2) of the input stage for a low is turned OFF because for high VCM, the PMOS transistors are OFF.

The NMOS bias conditioning circuit 222 includes a first diode-connected NMOS transistor (MNL6), which is configured to read the current through the PMOS transistors (MPX3, MPX4) of the replica input stage 220. The NMOS conditioning circuit 222 further includes a second diode-connected NMOS transistor (MNL8). The second diode-connected NMOS transistor (MNL8) is configured to read the current from a current source that is double the current used to bias the replica input stage (i.e., 2I1). The NMOS bias conditioning circuit 222 is configured so that the current flowing through MNL6 is subtracted from the current flowing toward MNL8 (i.e., 2I1) to form a difference current that is flowing through MNL8. This difference current is provided to an output NMOS transistor MNL5 with an amplification determined by a size difference between the output NMOS transistor (MNL5) and the second diode-connected NMOS transistor (MNL8). As shown in FIG. 2, MNL5 has a size factor of 18× while MNL8 has a size factor of 3×. Accordingly, the difference current is amplified at MNL5 by 6 times. This amplified current is used to bias the NMOS transistors (MNX1, MNX2) of the input stage 210. The NMOS bias conditioning circuit 222 operates similarly as the PMOS bias conditioning circuit 221 over the range of VCM so that the circuits provide bias currents that behave in complementary fashion over the range of VCM.

Figure 3:
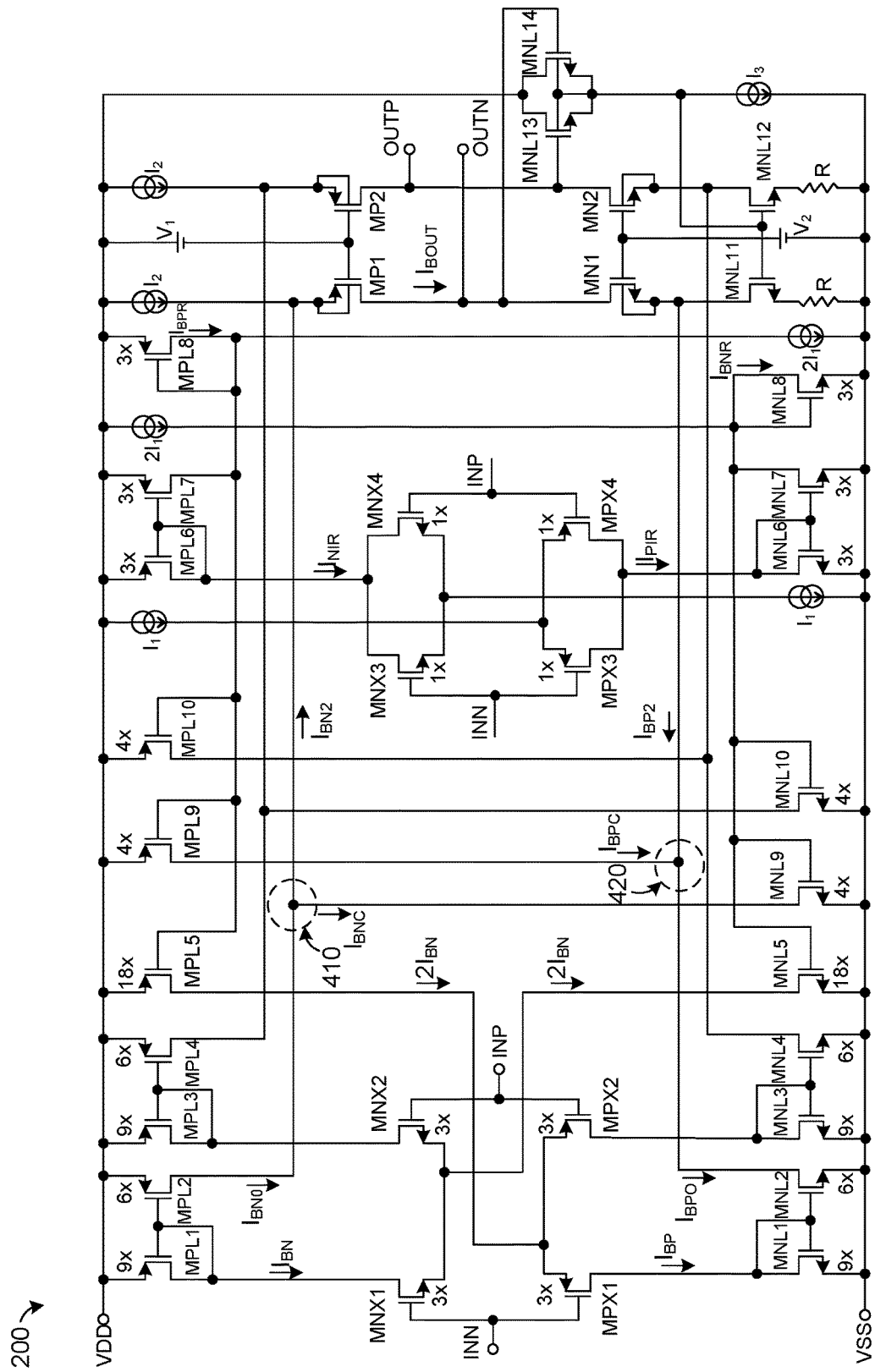
FIG. 3 is the schematic of FIG. 2 redrawn to clearly illustrate various currents, voltages, and nodes.

FIG. 3 is the schematic of the DOTA shown in FIG. 2 redrawn for clarity to illustrated various details. The details include currents, voltages, and nodes of the various stages and circuits of the DOTA and can be referred to when discussing the operation and performance of the DOTA.

Figure 4:
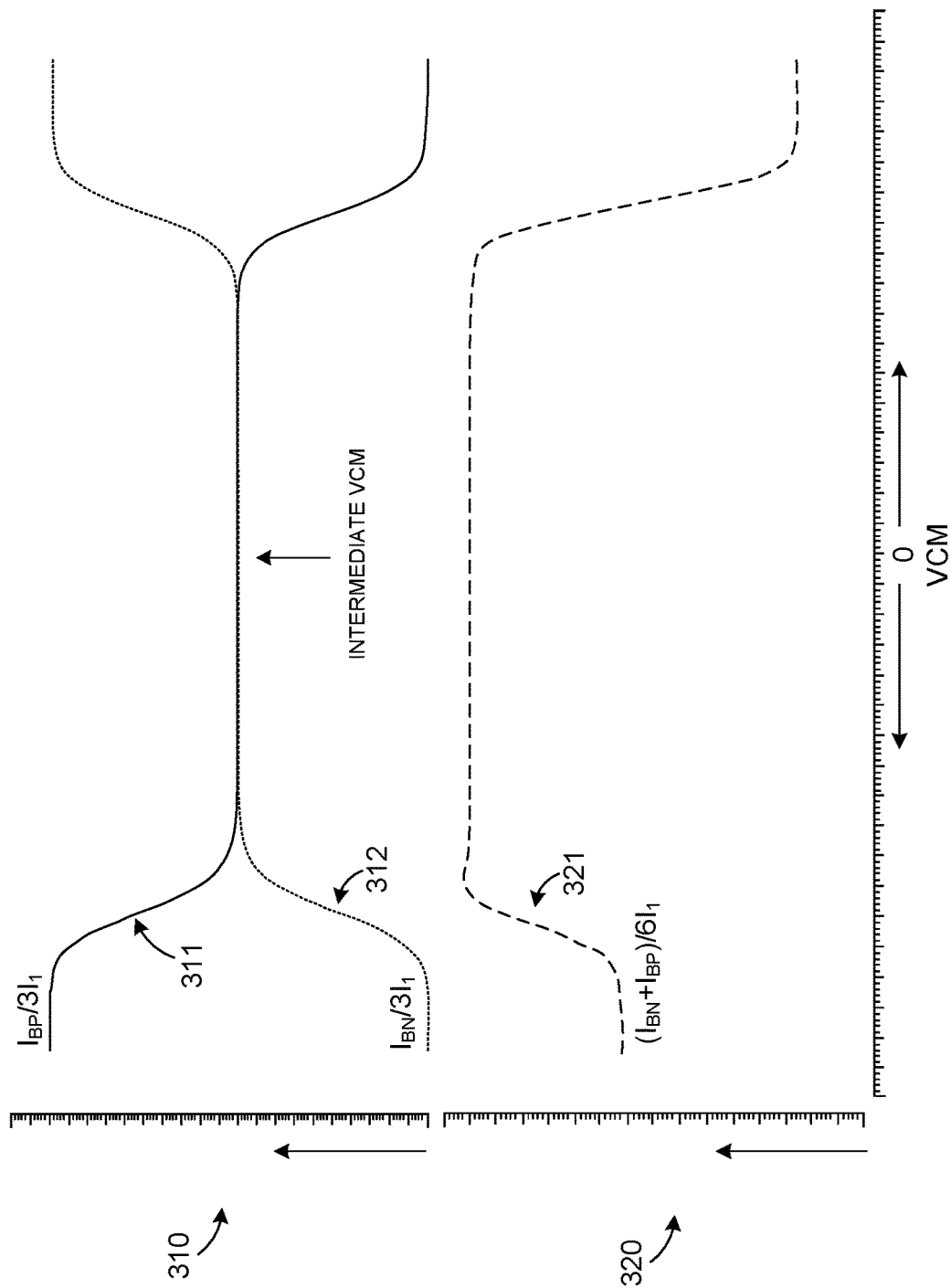
FIG. 4 are graphs of bias currents of the DOTA of FIG. 3 according to an implementation of the present disclosure.

FIG. 4 illustrates an example PMOS bias current (IBP) supplied to the PMOS transistors of the input stage (IBP) and NMOS bias current (IBN) supplied to the NMOS transistor of the input stage for a range of VCM. The graphs illustrate the behavior described above. Additionally, the bias currents are summed (IBN+IBP) and averaged to show that over the range of VCM the overall bias current is substantially constant. Because the transistors of the input stage are operated in weak inversion, the gain of the input stage (gm) is proportional to the overall bias current. Accordingly, the gain is substantially constant over the range of common mode voltages. In particular, a first graph 310 can show the variation of the bias currents for the input stage for a range of VCM. The graphs of IBN 312 and IBP 311 show the relative variation of the bias currents for the input NMOS and PMOS transistors, respectively. A range of the vertical axis of the first graph 310 may be from 0.0 to 2.2 (i.e., IBP/3I1, IBN/3I1), and the range of the horizontal axis of the first graph may be −1.8V to +1.8V (i.e., VCM) for a supply of 3.3V at 25° C. The currents (IBP 311, IBN 312) are symmetrical and form a "butterfly" shape at low/high VCM. At intermediate VCM (i.e., medium VCM) both currents (IBP 311, IBN 312) are equal, while at low/high VCM one current becomes zero while the other is doubled. In a second graph 320 both currents are added and divided by twice their average value to obtain an overall current 321. As shown in the second graph 320, at the intermediate VCM the overall current is 1, while at low/high VCM the variations to the overall current can be −0.6%/−1.3%, which can provide good bias control over the VCM domain. A range of the second of the vertical axis of the second graph 320 may be from 0.985 to 1.001 (i.e., (IBN+IBP)/6I1), and the range of the horizontal axis of the second graph 320 may be −1.8V to +1.8V (i.e., VCM) for a supply of 3.3V at 25° C.

Figure 5:
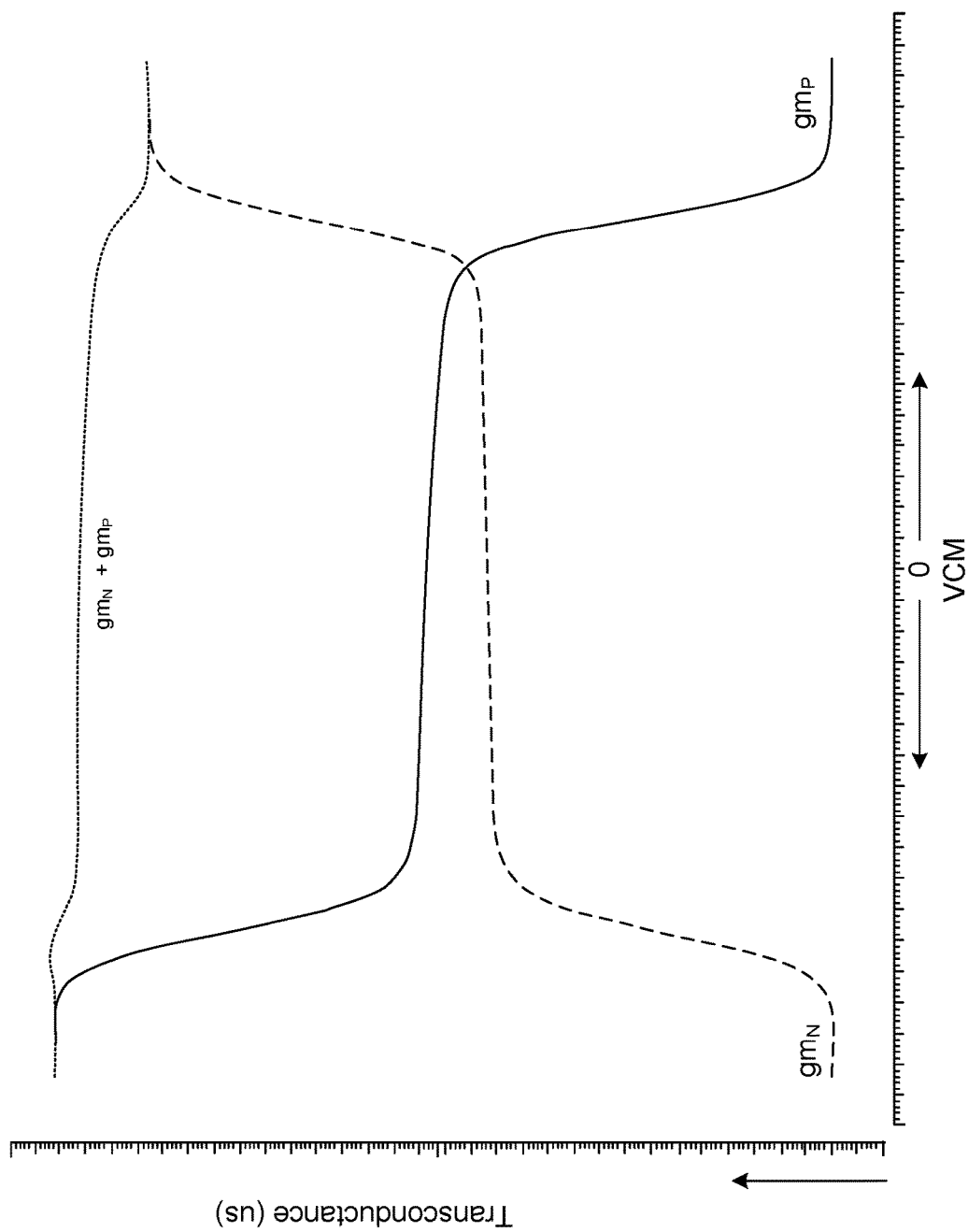
FIG. 5 are graphs of transconductance gain of the DOTA of FIG. 3 according to an implementation of the present disclosure.

FIG. 5 illustrates an example transconductance gain (gm) of the input stage 210 for a range of VCM. The transconductance gain has a first component (gmN), corresponding to the transconductance gain of an NMOS transistor of the input stage, and a second component (gmP), corresponding to the transconductance gain of a PMOS transistor of the input stage. The resulting transconductance gain is the sum of the first component and the second component (i.e., gm=gmN+gmP). The components are shaped so that when summed the transconductance gain (gm) is substantially constant over a range of VCM. A range of the vertical axis of the graph may be from −2 to +32 micro-Siemens (S) (i.e., gmn, gmp, gmn+gmp) and the range of the horizontal axis may be from −1.8V to +1.8V for a supply of 3.3V at 25° C.

Returning to FIG. 2, the DOTA 200 includes a PMOS current divider circuit 211 and an NMOS current divider circuit 212 (i.e., current divider circuits) that are coupled to respective outputs of the input stage 210. The current divider circuits include low-threshold voltage PMOS and NMOS transistors configured to function as current sources having output currents smaller than the input currents so that the currents feeding an output stage 230 can be reduced. Current dividers 211 and 212 are also used to determine for the input stage 210 similar conditions i.e. drain-to-source voltages, as the replica input stage 220 has. Thus, each of the eight input transistors of the input stage 210 (i.e., MNX1, MNX2, MPX1, MPx2) and the replica input stage 220 (i.e., MNX3, MNX4, MPX3, MPX4) has a diode-connected active load (MPL1, MPL3, MNL1, MNL3, MPL6, MNL6), making a smooth overall behavior of the circuit at any VCM value (e.g., see FIG. 4). Reducing the currents feeding the output stage 230 may be necessary because, as shown in FIG. 4, the currents biasing the input stage 210 can double at the edges of the VCM range. If the current increases are not compensated for, a performance of the DOTA (e.g., CMRR) could be reduced. Accordingly, the circuit can be configured to reduce the currents feeding the output stage as a function of VCM. For example, the transistor pairs MNL1-MNL2 and MNL3-MNL4 can output a current from the input stage 210 that can be higher than desirable for the output stage 230 (e.g., when VCM is low the current can be double that of an intermediate VCM). Accordingly, transistors MPL9 and MPL10 from bias conditioning circuit 221 may provide a current that is taken by MNL1-MNL2 and MNL3-MNL4, respectively so that the output stage receives a reduced current, where the reduction is based on VCM. Likewise, the transistor pairs MPL1-MPL2 and MPL3-MPL4 can output a current from the input stage 210 that can be higher than desirable for the output stage 230 (e.g., when VCM is high the current can be double that of an intermediate VCM). Accordingly, transistors MNL9 and MNL10 from bias conditioning circuit 222 are configured to provide a current that is subtracted from the currents sourced by MPL1-MPL2 and MPL3-MPL4, respectively, so that the output stage receives a reduced current, wherein the reduction is based on VCM.

The VCM-driven current sources use low threshold voltage NMOS and PMOS transistors. These current sources are either biasing the input stage or subtracting currents from the outputs of the current dividers, while reading the currents delivered by the replica input stage in its load. These currents are doubled for VCM lower than VSS+VTHNX or higher than VDD+VTHPX, maintaining almost constant gm for the input stage over a VCM range (e.g., the entire VCM range). By these means, the currents fed into the output stage are reduced and kept balanced over the VCM range. All current generators biasing the replica input stage and the VCM-driven current sources are PTAT to maintain constant gm of the input stage over temperature.

The input stage 210 includes pairs of medium threshold voltage NMOS transistors (MNX1, MNX2) and medium threshold PMOS transistors (MPX1, MPX2), the pairs having their back-gates connected to the VSS and VDD supply rails. The transistor of the input stage 210 operates in weak inversion. The input stage 210 has active loads. The active loads include two pairs of identical current dividers built with low threshold voltage PMOS transistors (MPL1, MPL2, MPL3, MPL4) and low voltage NMOS transistors (MNL1, MNL2, MNL3, MNL4). A pair of PMOS current dividers includes a first PMOS current divider (MPL1 and MPL2) and a second PMOS current divider (MPL3 and MPL4). A pair of NMOS current dividers includes a first NMOS current divider (MNL1 and MNL2) and a second NMOS current divider (MNL3 and MNL4). All 4 current dividers have the same 2-to-3 or 0.667 output-to-input current ratio determined by sizes of the transistors, such as shown in FIG. 2.

The input stage 210 has diode-connected, low-threshold-voltage PMOS and NMOS transistors acting as active loads. This configuration allows the transistors to have a proper operating point over a supply range (i.e., VDD-VSS) and a VCM domain. The active loads are part of current dividers. A first current divider (i.e., the PMOS current divider circuit 211) and a second current divider (i.e., the NMOS current divider circuit 212) (i.e., the current dividers) are connected after (i.e., at an output of) the first stage. The current dividers are implemented using low-threshold-voltage PMOS and NMOS transistors connected to the active loads of the first stage to form current sources having output currents that are smaller than the input currents. The current dividers may be useful in improving frequency compensation of the opamp.

The pair of PMOS current dividers include diode-connected low threshold transistors (MPL1, MPL3) that are configured to function as loads for the input stage. Likewise, the pair of NMOS current dividers include diode-connected low threshold transistors (MNL1, MNL3) that are configured to function as loads for the input stage. By using low threshold voltage transistors as loads for the medium threshold voltage transistors of the input stage 210, an operating point for the transistors is ensured throughout the VCM domain, even at the boundaries which can be 0.1V beyond the supply rails.

In order to reduce the amount of current transmitted (i.e., fed) to the output stage, pairs of low threshold voltage NMOS (MNL9-MNL10) and PMOS (MPL9-MPL10) are biased by MNL8 and MPL8, respectively. The pairs are used to take a fraction from the output current provided by the current dividers to the output stage 230. A current fed to the output stage 230 by the PMOS current divider circuit (IBN2) can be shown in FIG. 3 (e.g., current-divider node 410) and can be given by the equations (1) and (2), below. A similar discussion can be made for the NMOS current dividers and currents shown in FIG. 3 (e.g., current-divider node 420).

$$I_{BN2} = I_{BNO} - I_{BNC} = \frac{\left(\frac{W}{L}\right)_{MPL2}}{\left(\frac{W}{L}\right)_{MPL1}} \cdot I_{BN} - \frac{\left(\frac{W}{L}\right)_{MNL9}}{\left(\frac{W}{L}\right)_{MNL8}} \cdot I_{BNR} \quad (1)$$

$$I_{BN2} = \frac{\left(\frac{W}{L}\right)_{MPL2}}{\left(\frac{W}{L}\right)_{MPL1}} \cdot \frac{\left(\frac{W}{L}\right)_{MPL5}}{2 \cdot \left(\frac{W}{L}\right)_{MPL8}} \cdot I_{BNR} - \frac{\left(\frac{W}{L}\right)_{MNL9}}{\left(\frac{W}{L}\right)_{MNL8}} \cdot I_{BNR} \quad (2)$$

Based on the sizes (i.e., multiplication factors) for the DOTA 200 shown in FIG. 3, the current fed to the output stage 230 by the PMOS current divider circuit (IBN2) is given by the equation 3, below.

$$I_{BN2} = \frac{2}{3} \cdot \frac{18}{2 \cdot 3} \cdot I_{BNR} - \frac{4}{3} \cdot I_{BNR} = \frac{2}{3} \cdot I_{BNR} \quad (3)$$

The calculations assume that the transistors are in the normal active region. For medium VCM values, as IBNR is I1, IBN2 is (2/3)I1. At high VCM, as IBNR becomes 2I1, IBN2 will be doubled to (4/3)I1. At low VCM, IBN becomes zero, as the input transistors MNX1-MNX2 are in the off region. Because of this, IBNO is also zero, and IBN2 becomes negative as low as −(4/3)I1. Thus, balanced currents are fed into output stage versus VCM. Also their maximum values can be reduced from 2I1 (see IBNO) to (4/3)I1. Transistors MNL5-10 and MPL5-10, together with the PTAT generators 2I1 form the VCM-driven current generators for the output stage 230. From these, MNL5, MNL9-10, MPL5 and MPL9-10 are cascoded in the circuit to improve PSRR/CMRR performance of the DOTA 200.

If the NMOS replica input pair MNX3-MNX4 is working within its acceptable VCM range (e.g., VSS+VTHNX to VDD+0.1V, where VTHNX=0.4V is the medium threshold voltage for the NMOS working in weak inversion), its drain current will be constant and equal with its tail current I1. This will be also the current through the diode-connected MPL6. As a result, MPL7 will take the same amount of current, leaving the diode-connected MPL8 with half of the current sunk to VSS by the 2I1 current generator. This means that MPL5 will bias the PMOS input stage MPX1-MPX2 with a tail current of 6I1. For low VCM, the NMOS replica input pair will turn off, reducing the currents through MPL6, and respectively MPL7, to zero. In this case, MPL8 will have a current of 2I1, which will double the tail current for the input PMOS pair to 12I1, compensating the fact that the current within the NMOS input pair MNX1-MNX2 has also become zero, due to similar operating point with its replica MNX3-MNX4. A similar scenario occurs if considering the PMOS replica input pair MPX3-MPX4 operating point over VCM range. In this second case, acceptable VCM range is VSS-0.1V to VDD+VTHPX, where VTHPX=−0.4V is the medium threshold voltage for PMOS working in weak inversion.

Even within the transition regions, where the currents through the replica input pairs are somewhere in-between zero and I1, the active loads working as current generators will properly control the currents through the input pairs in order to maintain the same overall tail current and gm parameter. If considering that the input and replica input transistors are operated in weak inversion the transconductance of the chopper stage gm1 can be calculated as below, where 6I1 is the tail current of one input pair at mid VCM, VT is the thermal voltage and n is a parameter related with the process.

$$gm_1 = gm_N + gm_P = \frac{6I_1}{nV_T} = \frac{6 \cdot 0.6 \ \mu A}{1.59 \cdot 26 \ mV} \cong 87 \ \mu S \quad (4)$$

Returning to FIG. 2, the DOTA 200 includes an output stage 230. A core of the output stage is symmetrical and consists of pairs of isolated normal threshold voltage NMOS (MN1-MN2) and PMOS (MP1-MP2) transistors biased from VDD by two PTAT current generators I2. The current I2 can be much larger than I1. For example, 12 can be 4 times I1 (i.e., I2=4I1). The output stage 230 can also include a current source built with low threshold voltage NMOS MNL11-MNL12 transistors having source degeneration resistors R to improve noise performance. The output stage can also include CMFB (common-mode feed-back) circuitry built with low threshold voltage NMOS (MNL13-MNL14) transistors, and biased with a PTAT current I3, to control the output DC voltage levels. A voltage V2, configured to bias the gates of the output NMOS transistors, may also be modified in correlation with VCM value to optimize performance (e.g., operating point, CMRR) of the DOTA.

Figure 6:
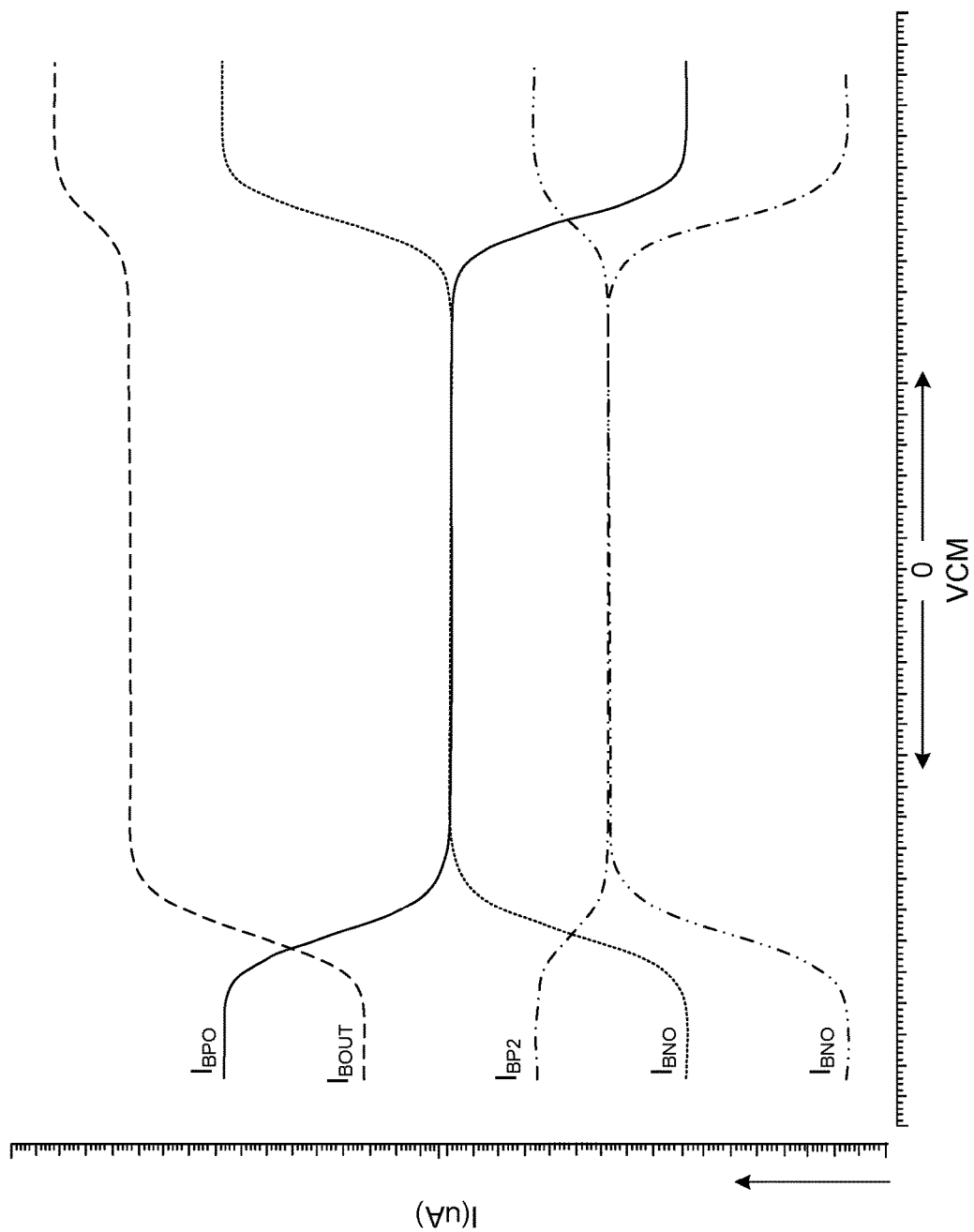
FIG. 6 are graphs of currents of the DOTA illustrating the reduction of currents of the input stage versus currents out of the current dividers.

FIG. 6 are graphs of currents of the DOTA illustrating the reduction of currents of the input stage compared to currents flowing out of the current dividers for a range of common mode voltages. The graphs include output currents (IBNO, IBPO) flowing out of the current dividers. The output currents (IBNO, IBPO) are similar to those biasing the input stage (IBOUT) with a difference being that the levels of these currents are reduced by about ⅓. A range of the vertical axis of the graph may be from −1.0 µA to 3.4 µA (i.e., IBPO, IBOUT, IBP2, IBNO, IBN2) and the range of the horizontal axis of the graph may be −1.8V to +1.8V (i.e., VCM) for a supply of 3.3V at 25° C.

The graphs of FIG. 6 further include input currents (IBN2, IBP2) flowing into the output stage (i.e., after correction currents have been applied). As shown, the input currents flowing into the output stage (IBN2, IBP2) are similar to those flowing out of the current dividers (IBNO, IBPO) with a difference between that these levels of these currents are reduced by about ⅓.

The graphs of FIG. 6 further include the bias current (IBOUT) through the output transistors. The overall variation of this current with VCM is about 2 to 1. This variation can be based on I2. For example, increasing I2 can reduce this variation. The currents in FIG. 6 are graphed over a range of VCM, with the range of VCM for FIG. 6 being the same as the range of VCM for FIGS. 4 and 5.

Figure 7:
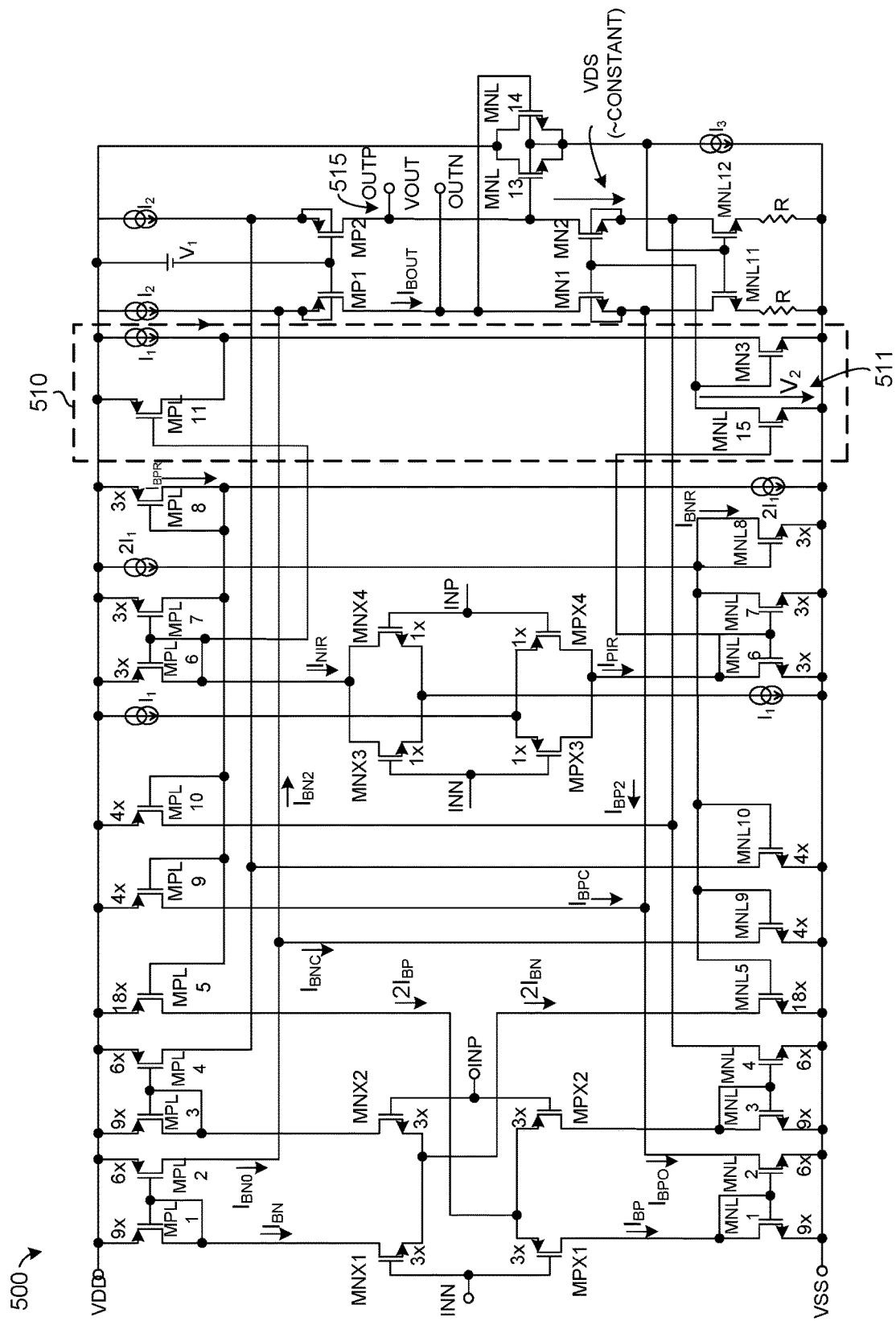
FIG. 7 is a schematic of a DOTA that can be used with chopper stabilization according to a second possible implementation of the present disclosure.

FIG. 7 is a schematic of a possible implementation of the DOTA including circuitry for modifying the voltage V2 for biasing the gates of the output NMOS transistor based on the common mode voltage. The DOTA 500 includes a VCM-controlled bias circuit 510 configured to adjust the voltage V2, used to bias the gates of MN1-MN2. The VCM-controlled bias circuit 510 includes a diode-connected (long) transistor, MN3, that is biased from a PTAT current I1. The VCM-controlled bias circuit further includes transistors MNL15 and MPL11, which are driven, according to VCM, from MNL6 and MPL6. The transistors are configured to adjust the drain current through MN3 by fractions (between −40% and +20%, for example) at low/high VCM, which in turn, adjust the value of V2 in order maintain a drain-to-source voltage (VDS) of NM1-MN2 at an almost constant value over the range of VCM. This performance may require a particular size (e.g., W/L) of MNL15 and MPL1.

Figure 8:
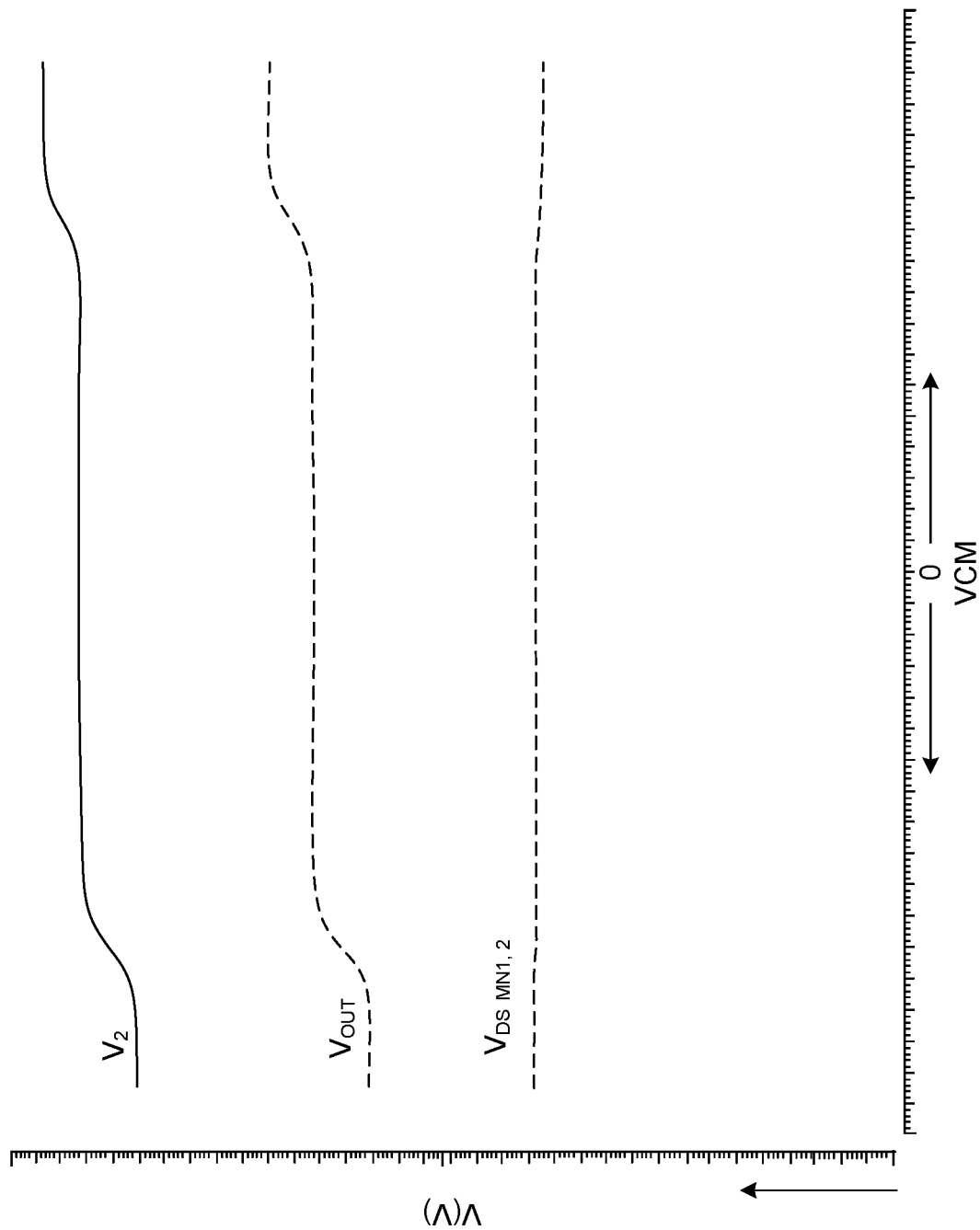
FIG. 8 are graphs of voltages of the DOTA of FIG. 7 according to an implementation of the present disclosure.

FIG. 8 are graphs illustrating the gate bias voltages and drain-to-source voltages of the output NMOS transistors (MN1, MN2) when controlled by the VCM-controlled bias circuit 510 of FIG. 7. The graphs illustrate variation of a bias voltage 511 (V2) used to bias the gates of the output NMOS transistors (MN1, MN2). The bias voltage versus VCM is shaped by the VCM-controlled bias circuit 510 to be well correlated with an output voltage 515 (VOUT) at either output (OUTP, OUTN) of the DOTA 500. The variation of VOUTN/VOUTP versus VCM is given by the variation of the drain currents through MNL11-MNL12. Accordingly, by correlating (e.g., matching) the bias voltage 511 (V2) variation to the output voltage 515 (VOUT) variation, the drain-to-source voltage of the output NMOS transistor may be made substantially constant (i.e., constant). This constant drain-to-source voltage can help to maintain a suitable dynamic voltage gain of the DOTA 500 over the range of VCM. The voltages in FIG. 8 are graphed over a range of VCM, with the range of VCM for FIG. 8 being the same as the range of VCM for FIGS. 4, 5, and 6. A range of the vertical axis of the graph may be 0V to 1.4V (i.e., V2, Vout, VDSmn1, VDSmn2) and the range of the horizontal axis of the graph may be −1.8V to +1.8V (i.e., VCM) for a supply of 3.3V at 25° C.

Figure 9:
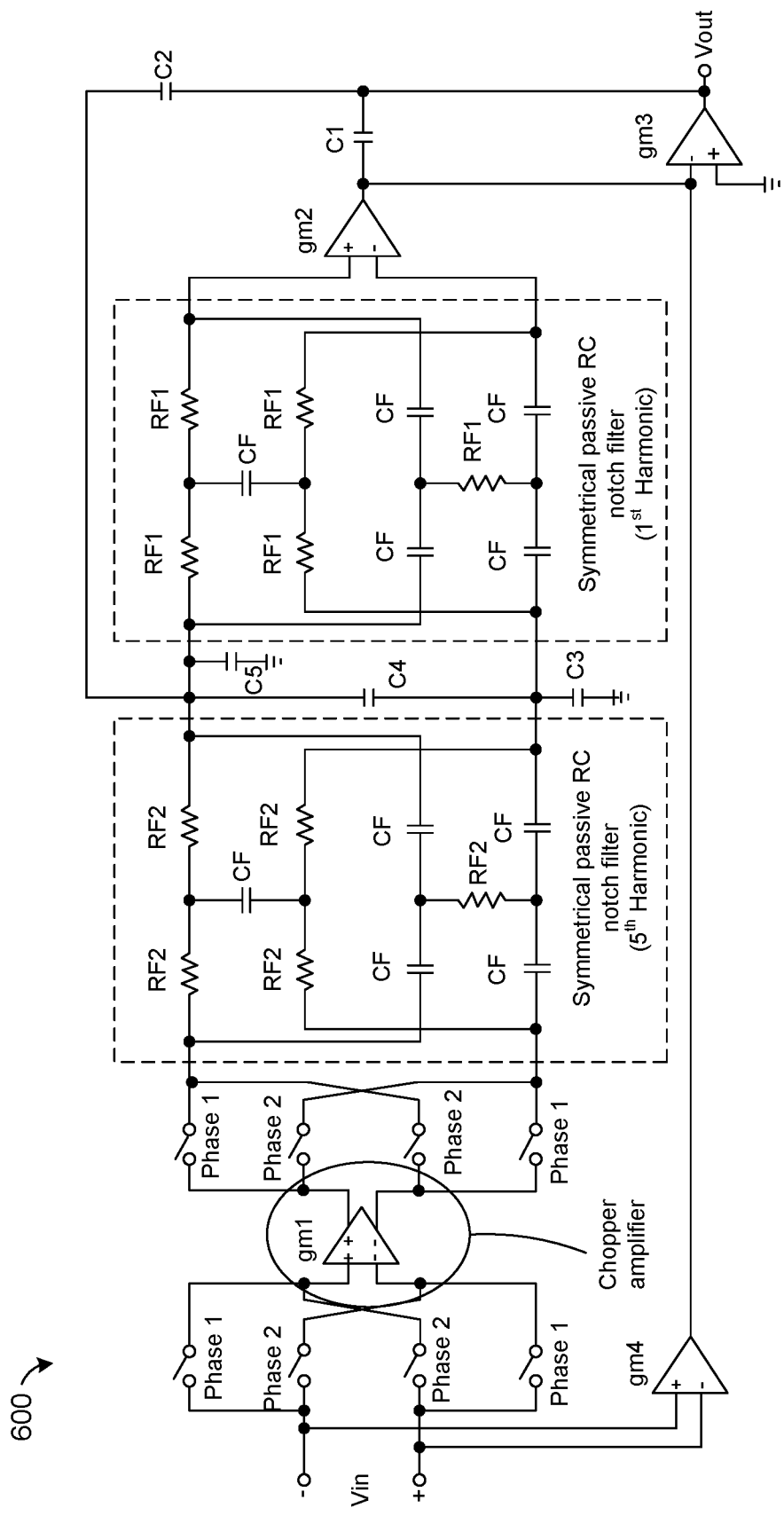
FIG. 9 is schematic of an opamp having chopper stabilization according to a second possible implementation of the present disclosure.

FIG. 9 is a schematic of a second possible implementation of a chopper-stabilized operational amplifier which uses the disclosed circuit of FIG. 2 or FIG. 7 as a chopper amplifier stage. For example, the opamp with chopper stabilization shown in FIG. 9 may be a more detailed view of the opamp shown in FIG. 1. The circuit techniques implemented in the chopper amplifier stage gm1 may be equally used in stage gm4 to benefit from the above described performance improvements. The performance of the chopper-stabilized amplifier 600 is related with a dynamic gain of the chopper stage. The dynamic gain achieved at the chopping frequency (e.g., fCLK=100 kHz). This gain is lower than the DC gain due to the dynamic output conductance as shown below. The estimated COUT=45 femto farads (fF) is the combined drain capacitances of devices MN1, MN2, MP1, and MP2; plus the gate capacitances of MNL13 and MNL14; these devices may be made as small as possible and can include both the transconductance of the input stage and the attenuation brought by the current dividers.

$$A_{Vgm1} = \frac{gm_1 \cdot F_1}{4 \cdot f_{CLK} \cdot C_{OUT}} = \frac{87 \; \mu S \cdot 0.667}{4 \cdot 100 \; kHz \cdot 45 fF} \cong 3{,}220 \qquad (5)$$

The dynamic gain value is more than enough to reduce an overall estimated ±12 mV VOS given by stages gm2 and gm4 of the chopper-stabilized amplifier 600 down to ±4 microvolt (µV). This means good VOS performance and AVgm1 that is almost constant with VCM, giving improved VOS versus VCM, which in turn can correspond to an improved CMRR performance. The DOTA used as the differential chopper amplifier is noninverting, with respect to the differential voltages V(OUTP)–V(OUTN) versus V(INP)–V(INN).

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A differential operational transconductance amplifier (DOTA), comprising:
an input stage coupled to an input of the DOTA, the input including a positive input and a negative input configured to receive a common mode voltage;
a replica input stage coupled to the input of the DOTA, the replica input stage having a transistor configuration corresponding to and reduced in transistor size relative to the input stage to reduce a current drawn by the DOTA, the replica input stage configured to conduct current in response to the common mode voltage at the input;
a plurality of bias conditioning circuits configured to detect the current conducted by the replica input stage and output a bias current to the input stage based on the current conducted by the replica input stage such that the input stage is biased based on the common mode voltage;
an output stage configured to receive output currents from the input stage; and
current divider circuits positioned between the input stage and the output stage and configured to reduce the output currents from the input stage before being received by the output stage.

2. The DOTA according to claim 1, wherein the input stage is biased based on the common mode voltage so that a gain of the input stage is approximately constant for a range of common mode voltages, the range of common mode voltages being at least a lower rail voltage to an upper rail voltage of the DOTA.

3. The DOTA according to claim 1, wherein the replica input stage includes:
a pair of NMOS transistors coupled to the positive input and the negative input, the pair of NMOS transistors having a NMOS medium threshold corresponding to a positive supply voltage; and
a pair of PMOS transistors coupled to the positive input and the negative input, the pair of PMOS transistors having a PMOS medium threshold corresponding to a negative supply voltage.

4. The DOTA according to claim 3, wherein each transistor of the replica input stage is three (3) times smaller than transistors of the input stage.

5. The DOTA according to claim 1, wherein the input stage includes a pair of NMOS transistors coupled to the positive input and the negative input and a pair of PMOS transistors coupled to the positive input and the negative input, the pair of NMOS transistors having a NMOS medium threshold corresponding to a positive supply voltage and the pair of PMOS transistors having a PMOS medium threshold corresponding to a negative supply voltage.

6. The DOTA according to claim 5, wherein the plurality of bias conditioning circuits include:
a PMOS bias conditioning circuit configured to bias the pair of PMOS transistors with a PMOS bias current; and
an NMOS bias conditioning circuit configured to bias the pair of NMOS transistors with an NMOS bias current.

7. The DOTA according to claim 6, wherein:
at an intermediate common mode voltage (VCM), the PMOS bias current is equal to an intermediate bias current and the NMOS bias current is equal to the intermediate bias current;
at a low VCM, the PMOS bias current is higher than the intermediate bias current and the NMOS bias current is lower than the intermediate bias current; and
at a high VCM, the PMOS bias current is lower than the intermediate bias current and the PMOS bias current is higher than the intermediate bias current.

8. The DOTA according to claim 5, wherein:
the NMOS medium threshold is in a range of 0.5V to 0.6V and the positive supply voltage is approximately 0.8V; and
the PMOS medium threshold is in a range of −0.5V to −0.6V and the negative supply voltage is approximately −0.8V.

9. The DOTA according to claim 1, wherein the plurality of bias conditioning circuits include:

a PMOS bias conditioning circuit including PMOS transistors, each PMOS transistor having a PMOS low threshold that is in a range of −0.35V to −0.45V; and
an NMOS bias conditioning circuit including low threshold NMOS transistors, each NMOS transistor having an NMOS low threshold that is in a range of +0.35V to +0.45V.

10. A chopper-stabilized amplifier, comprising:
a main amplifier configured to receive an input signal at an input, the input having an input offset voltage; and
a chopper amplifier coupled between a first chopper configured to receive the input signal and a second chopper configured transmit an output signal to the main amplifier in order to reduce the input offset voltage, the chopper amplifier including:
an input stage coupled to a differential input of the chopper amplifier, the differential input including a positive input and a negative input configured to receive a common mode voltage;
a replica input stage coupled to the differential input of the chopper amplifier, the replica input stage having a transistor configuration corresponding to and reduced in transistor size relative to the input stage to reduce a current drawn by the chopper amplifier, the replica input stage configured to conduct current in response to the common mode voltage at the differential input; and
a plurality of bias conditioning circuits configured to detect the current conducted by the replica input stage and output a bias current to the input stage based on the current conducted by the replica input stage such that the input stage is biased based on the common mode voltage.

11. The chopper-stabilized amplifier according to claim 10, wherein the plurality of bias conditioning circuits is further configured to output bias currents based on the common mode voltage to reduce output currents of a plurality of current divider circuits.

12. The chopper-stabilized amplifier according to claim 10, wherein the input stage is biased based on the common mode voltage so that a gain of the input stage is approximately constant for a range of common mode voltages, the range of common mode voltages being at least a lower rail voltage to an upper rail voltage of the chopper amplifier.

13. The chopper-stabilized amplifier according to claim 10, further comprising:
an output stage configured to receive output currents from the input stage; and
current divider circuits positioned between the input stage and the output stage and configured to reduce the output currents from the input stage before reaching the output stage.

14. The chopper-stabilized amplifier according to claim 10, wherein the replica input stage includes:
a pair of NMOS transistors coupled to the positive input and the negative input, the pair of NMOS transistors having an NMOS medium threshold corresponding to a positive supply voltage; and
a pair of PMOS transistors coupled to the positive input and the negative input, the pair of NMOS transistors, the pair of PMOS transistors having a PMOS medium threshold corresponding to a negative supply voltage.

15. The chopper-stabilized amplifier according to claim 14, wherein each transistor of the replica input stage is three (3) times smaller than transistors of the input stage.

16. The chopper-stabilized amplifier according to claim 10, wherein the input stage includes a pair of NMOS transistors coupled to the positive input and the negative input and a pair of PMOS transistors coupled to the positive input and the negative input, the pair of NMOS transistors having a NMOS medium threshold corresponding to a positive supply voltage and the pair of PMOS transistors having a PMOS medium threshold corresponding to a negative supply voltage.

17. The chopper-stabilized amplifier according to claim 16, wherein:
the plurality of bias conditioning circuits include a PMOS bias conditioning circuit configured to bias the pair of PMOS transistors with a PMOS bias current;
the plurality of bias conditioning circuits further include an NMOS bias conditioning circuit configured to bias the pair of NMOS transistors with an NMOS bias current;
at an intermediate common mode voltage (VCM), the PMOS bias current is equal to an intermediate bias current and the NMOS bias current is equal to the intermediate bias current;
at a low VCM, the PMOS bias current is higher than the intermediate bias current and the NMOS bias current is lower than the intermediate bias current; and
at a high VCM, the PMOS bias current is lower than the intermediate bias current and the PMOS bias current is higher than the intermediate bias current.

18. A method, comprising:
receiving a common mode voltage at an input of a differential operational transconductance amplifier (DOTA), the DOTA including an input stage, a replica input stage, a plurality of bias conditioning circuits, a plurality of current divider circuits, and an output stage;
conducting current at the replica input stage in response to the common mode voltage at the input of the DOTA, the replica input stage coupled to the input of the DOTA and including transistors that are smaller than transistors of the input stage to reduce a current drawn by the DOTA,
detecting the current conducted by the replica input stage using the plurality of bias conditioning circuits;
outputting, from the plurality of bias conditioning circuits, a bias current to the input stage based on the current conducted by the replica input stage such that the input stage is biased based on the common mode voltage;
outputting, from the plurality of bias conditioning circuits, bias currents based on the common mode voltage to reduce output currents from a plurality of current divider circuits, the plurality of current divider circuits positioned between the input stage and the output stage to reduce the output currents from the input stage; and
receiving the reduced output currents from the input stage at the output stage.

19. The method according to claim 18, further comprising:
biasing transistors of the output stage according to the common mode voltage using a VCM-controlled bias circuit, the VCM-controlled bias circuit coupled between the replica input stage and the output stage.

* * * * *